(12) United States Patent
Phillips

(10) Patent No.: US 8,739,383 B2
(45) Date of Patent: Jun. 3, 2014

(54) METHOD AND APPARATUS FOR ALIGNING MIRROR BLOCKS OF A MULTI-ELEMENT MIRROR ASSEMBLY

(75) Inventor: Alton H. Phillips, East Palo Alto, CA (US)

(73) Assignee: Nikon Corporation, Tokyo (JP)

( * ) Notice: Subject to any disclaimer, the term of this patent is extended or adjusted under 35 U.S.C. 154(b) by 996 days.

(21) Appl. No.: 12/763,298

(22) Filed: Apr. 20, 2010

(65) Prior Publication Data

US 2010/0263192 A1    Oct. 21, 2010

Related U.S. Application Data

(60) Provisional application No. 61/170,753, filed on Apr. 20, 2009.

(51) Int. Cl.
*B23P 11/00* (2006.01)

(52) U.S. Cl.
USPC ............ 29/468; 29/525.11; 29/529.1; 355/30

(58) Field of Classification Search
USPC ........... 29/592.1, 832–834, 468, 271; 355/30, 355/53, 77; 165/104.33; 359/845
See application file for complete search history.

(56) References Cited

U.S. PATENT DOCUMENTS

| | | | |
|---|---|---|---|
| 3,866,140 A * | 2/1975 | Hobart et al. | 372/93 |
| 4,003,640 A | 1/1977 | Hansen | |
| 4,190,327 A | 2/1980 | Hughes | |
| 4,443,059 A | 4/1984 | Wells | |
| 5,263,536 A | 11/1993 | Hulburd et al. | |
| 5,276,584 A | 1/1994 | Collins et al. | |
| 5,334,892 A * | 8/1994 | Chitayat | 310/12.06 |
| 5,366,933 A * | 11/1994 | Golwalkar et al. | 29/827 |
| 6,208,407 B1 * | 3/2001 | Loopstra | 355/53 |
| 6,359,678 B1 | 3/2002 | Ota | |
| 6,880,942 B2 | 4/2005 | Hazelton et al. | |
| 6,989,922 B2 | 1/2006 | Phillips et al. | |
| 7,065,980 B1 | 6/2006 | Knight | |
| 7,804,575 B2 * | 9/2010 | Cadee et al. | 355/30 |
| 2003/0234993 A1 | 12/2003 | Hazelton et al. | |
| 2006/0176460 A1 | 8/2006 | Phillips | |
| 2006/0181689 A1 | 8/2006 | Phillips | |
| 2007/0091485 A1 | 4/2007 | Phillips et al. | |

(Continued)

OTHER PUBLICATIONS

U.S. Appl. No. 11/983,615, entitled "Self-Correcting Optical Elements for High-Thermal-Load Optical Systems", filed Nov. 9, 2007.

(Continued)

*Primary Examiner* — Minh Trinh

(57) ABSTRACT

Methods and apparatus for aligning a mirror block with a base plate to form a mirror assembly are disclosed. According to one aspect of the present invention, a method for forming a mirror assembly includes positioning a mirror block in contact with a base plate that has at least one alignment feature, and indexing a portion of an alignment tool with respect to the base plate. The method also includes applying at least a first force by moving the mirror block with respect to alignment feature. A determination is made as to when a first surface of the mirror block is substantially coplanar with a first surface of the alignment feature. The mirror block is coupled to the base plate when the first surface of the mirror block is substantially coplanar with the first surface of the alignment feature.

11 Claims, 11 Drawing Sheets

(56) References Cited

U.S. PATENT DOCUMENTS

| | | |
|---|---|---|
| 2007/0211352 A1 | 9/2007 | Phillips |
| 2008/0003649 A1 | 1/2008 | Maltezos et al. |
| 2008/0061306 A1 | 3/2008 | Chiu et al. |
| 2010/0110397 A1 | 5/2010 | Phillips et al. |
| 2010/0263192 A1* | 10/2010 | Phillips .......................... 29/468 |
| 2012/0099088 A1* | 4/2012 | Phillips .......................... 355/30 |

OTHER PUBLICATIONS

The textbook by Yoder, "Optical-Mechanical System Design", Third Edition, pp. 527-553, published in Nov. 28, 2005 by CRC Press.

Brauer et al., "Liquid-Metal-Cooled, Curved-Crystal Monochromator for Advanced Photon Source Bending-Magnet Beamline 1-BM", SRI '95 APS X-ray Centennial Symposium/Seventh Users Meeting for the APS, Oct. 16-20, 1995.

Frisch et al., "Advanced Collimator Engineering for the NLC", Proceedings of the 2001 Particle Accelerator Conference, Chicago, 2001.

Smither et al., Liquid Gallium Cooling of Silicon Crystals in High Intensity Photon Beams (invited), Rev. Sci. Instrum. 60(7), Jul. 1989.

International Search Report and Written Opinion for International Application No. PCT/US2009/061902, mailed Dec. 14, 2009.

* cited by examiner

METHOD AND APPARATUS FOR ALIGNING MIRROR BLOCKS OF A MULTI-ELEMENT MIRROR ASSEMBLY

CROSS-REFERENCE TO RELATED APPLICATION

This patent application claims priority to U.S. Provisional Patent Application No. 61/170,753, entitled "Multi-Element Mirror Assembly and Alignment," filed Apr. 20, 2009, which is incorporated herein by reference in its entirety. This patent application is related to co-pending U.S. patent application Ser. No. 12/261,798, entitled "High Heat Load Optics with a Liquid Metal Interface for Use in an Extreme Ultraviolet Lithography System," filed Oct. 30, 2008, which is incorporated herein by reference in its entirety.

BACKGROUND OF THE INVENTION

1. Field of the Invention

The present invention relates generally to equipment used in semiconductor processing. More particularly, the present invention relates to a multi-element mirror assembly suitable for use in an extreme ultraviolet lithography (EUV) system.

2. Description of the Related Art

Extreme ultraviolet (EUV) lithography is a semiconductor fabrication technology which enables semiconductors with small features, e.g., features with dimensions of approximately 45 nanometers (nm) or less, to be produced. In EUV lithography, a laser may heat xenon gas to create a plasma, although there are other methods used to make EUV plasmas. Electrons come off the plasma and radiate light.

FIG. 1 is a block diagram representation of an EUV lithography system. An EUV lithography system 100 includes a vacuum chamber 128 which contains a source 104. Source 104 provides electrons that radiate light, and includes a plasma source 108 and a collector mirror 112 that reflects electrons which come off of the plasma generated by plasma source 108 into an illuminator unit 116b of a body 116 of EUV lithography system 100. Illuminator unit 116b is a condenser that effectively collects light and directs or otherwise focuses the light onto a reticle 120. That is, illuminator unit 116b conditions light from plasma source 108 to improve uniformity. The light reflects off of reticle 120, through projection optics 116a of body 116, and onto a surface of a wafer 124.

Mirrors included in an EUV lithography system generally absorb some of light or radiation that comes into contact with the mirrors. Such mirrors (not shown) may be associated with illuminator unit 116b as well as with projection optics 116a. A mirror may effectively be a mirror assembly that includes a plurality of mirror blocks that are substantially directly cooled by a heat exchanger that includes wells of liquid metal, as described in co-pending U.S. patent application Ser. No. 12/261,798, filed Oct. 30, 2008, which is incorporated herein by reference in its entirety. As shown in FIG. 2, a mirror assembly may include a base plate and multiple mirror blocks. A mirror assembly 240 includes a plurality of mirror blocks 240a. Each mirror block 240a is coupled to a shared base plate 240b.

To align mirror blocks 240a relative to base plate 240b, press-fit pins are generally used. Press-fit pins are may be included in base plate 240b, and holes and slots into which the press-fit pins are positioned may be included in mirror blocks 240a. While the use of press-fit pins is effective in accurately aligning mirror blocks 240a, there may be insufficient space in mirror assembly 240 to accommodate press-fit pins, holes, and slots. For example, when mirror blocks 240a include multiple mirror facets, there is typically insufficient space for press-fit pins, holes, and slots. In addition, liquid metal wells (not shown) and/or posts (not shown), e.g., for transferring heat, included in mirror assembly 240 may occupy any additional space available in mirror assembly 240.

SUMMARY OF THE INVENTION

The present invention pertains to using an external alignment tool, in conjunction with an alignment feature on a base plate of a mirror assembly, to align a mirror element or block with respect to the base plate.

According to one aspect of the present invention, a method for forming a mirror assembly that includes a mirror block and a base plate with at least one base plate alignment feature includes positioning the mirror block in contact with the base plate, and indexing at least one portion of an alignment tool with respect to the base plate. The method also includes applying at least a first force by moving the mirror block with respect to base plate alignment feature. A determination is made as to when a first surface of the mirror block is substantially coplanar with a first surface of the base plate alignment feature. Such a determination involves determining when the portion of the alignment tool abuts the first surface of the mirror block and the first surface of the at least one base plate alignment feature. The mirror block is coupled to the base plate when it is determined that the first surface of the mirror block is substantially coplanar with the first surface of the at least one base plate alignment feature.

In one embodiment, the alignment tool includes a portion associated with positioning the mirror block along an x-axis, a portion associated with positioning the mirror block along a y-axis, and a portion associated with positioning the mirror block about a z-axis. In another embodiment, applying at least the first force includes applying the first force to the portion of the alignment tool to cause the mirror block to move.

According to another aspect of the present invention, a system for aligning at least a first mirror block with respect to a base plate includes a first component and a generator. The first component is arranged to be indexed with respect to the base plate, and the generator is configured to generate a force. The force causes the first mirror block to move with respect to the base plate until a surface of the first component abuts a surface of the first mirror block and a surface of a first alignment feature of the base plate, and the surface of the mirror block and the surface of the alignment feature are approximately coplanar. In one embodiment, the first component is arranged to be indexed with respect to the surface of the first alignment feature, and the system also includes a second component arranged to be indexed with respect to a surface of a second alignment feature of the base plate, as well as a third component arranged to be indexed with respect to a surface of a third alignment feature of the base plate.

In accordance with another aspect of the present invention, a method for aligning a mirror block with respect to a base plate includes indexing a first portion of an alignment tool with respect to a first section of the mirror block, indexing a second portion of the alignment tool with respect to a second section of the mirror block, and indexing a third portion of the alignment tool with respect to a third section of the mirror block. The first portion is configured to position the first section of the mirror block with respect to a first axis, the second portion is configured to position the second section of the mirror block with respect to a second axis, and the third portion is configured to position the third section of the mirror block with respect to a third axis.

BRIEF DESCRIPTION OF THE DRAWINGS

The invention will be readily understood by the following detailed description in conjunction with the accompanying drawings, in which.

DETAILED DESCRIPTION OF THE INVENTION

Example embodiments of the present invention are discussed below with reference to the various figures. However, those skilled in the art will readily appreciate that the detailed description given herein with respect to these figures is for explanatory purposes, as the invention extends beyond these embodiments.

Mirror assemblies used in an extreme ultraviolet (EUV) lithography system may include multiple mirror elements, each of which may include multiple mirror facets. For example, mirror assemblies may be fly's eye mirror assemblies. As described in co-pending U.S. patent application Ser. No. 12/261,798, which is incorporated herein by reference, a mirror assembly may be formed from multiple mirror blocks that are coupled to a base plate.

To align mirror blocks relative to a base plate, features may be added to the base plate, and external tools, e.g., tools which are not a part of a mirror assembly, may be employed. In one embodiment, external tools may be used to align faces of the mirror blocks to the faces of features machined on a base plate. External tools may provide a surface that aligns a side of a mirror block with a side of a feature machined on, or otherwise provided on, a base plate. That is, mirror blocks may be indexed to features of a base plate using an eternal tool. A mirror alignment process may generally include providing a force that causes a side of a mirror block to come into contact with a surface of an external tool such that the external tool may align the side of the mirror block relative to the side of a feature of a base plate.

A mirror assembly that includes mirror blocks and a base plate typically also includes a heat exchanger that is suitable for cooling the mirror blocks. A number of liquid metal wells, e.g., approximately eight, may cooperate with the heat exchanger to substantially directly cool the mirror blocks. In one embodiment, the base plate is not in a cooling path, and mounting regions of the base plate, or areas of the base plate onto which mirror blocks may be mounted, are notched or otherwise machined to substantially limit the effect of differential thermal expansion between at least one of the mirror blocks and the base plate.

Figure 1:
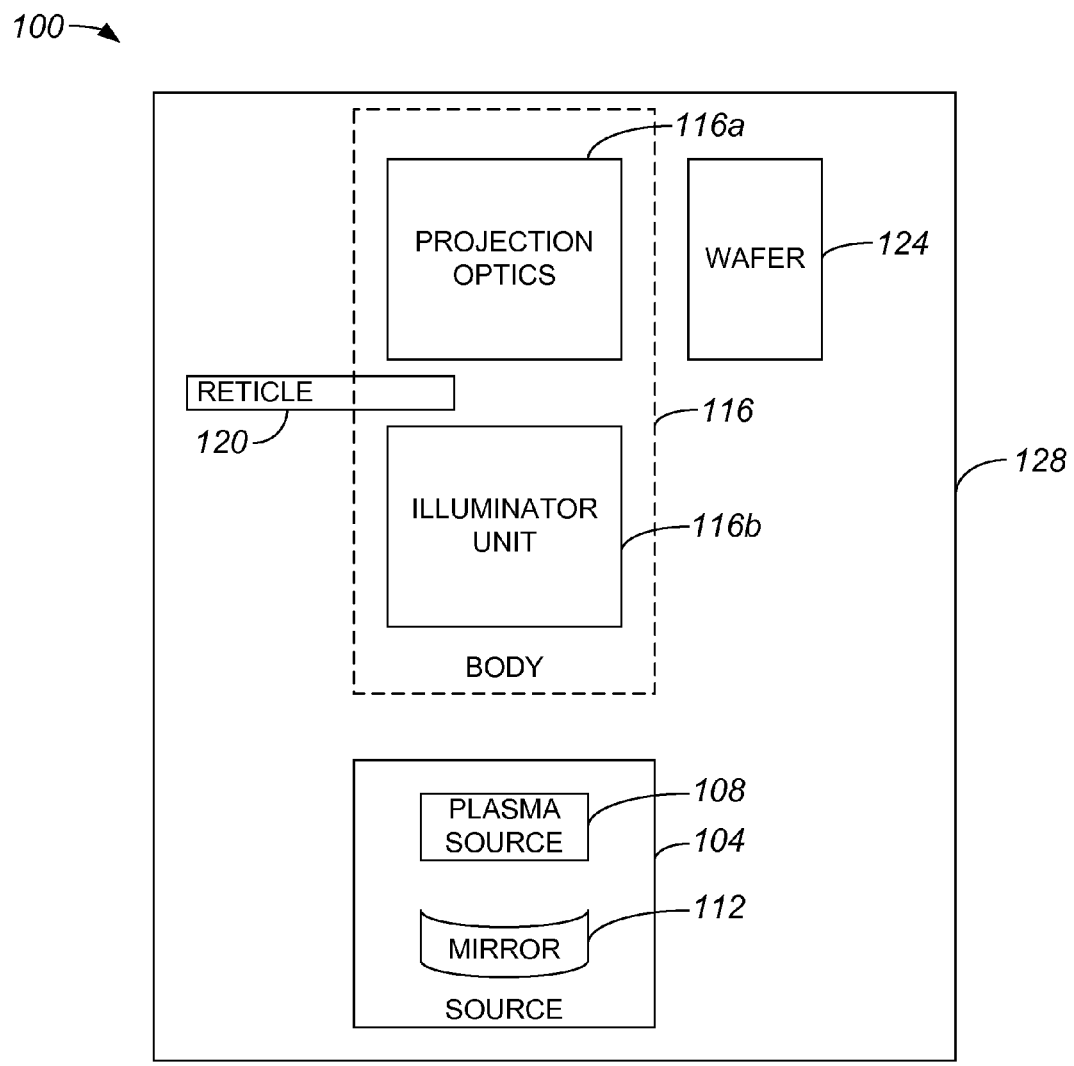
FIG. 1 is a block diagram representation of an extreme ultraviolet (EUV) lithography system.
Figure 2:
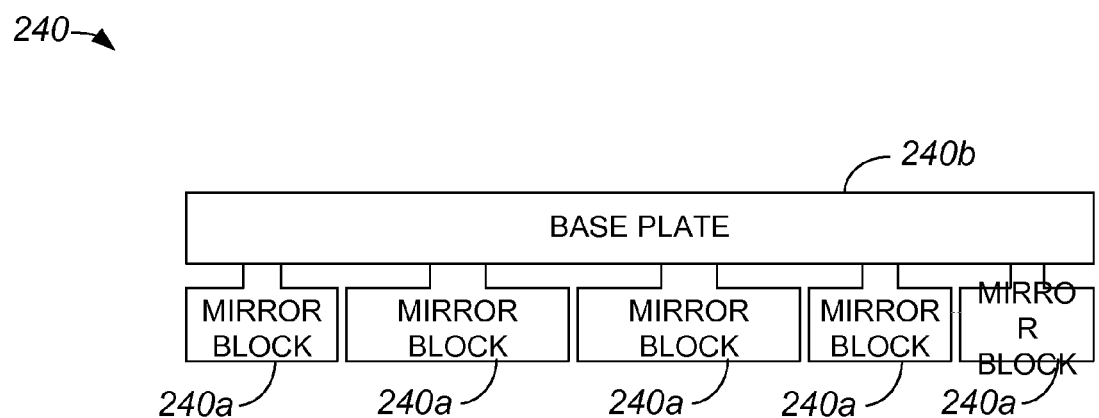
FIG. 2 is a block diagram representation of a mirror assembly which includes multiple mirror blocks.
Figure 3:
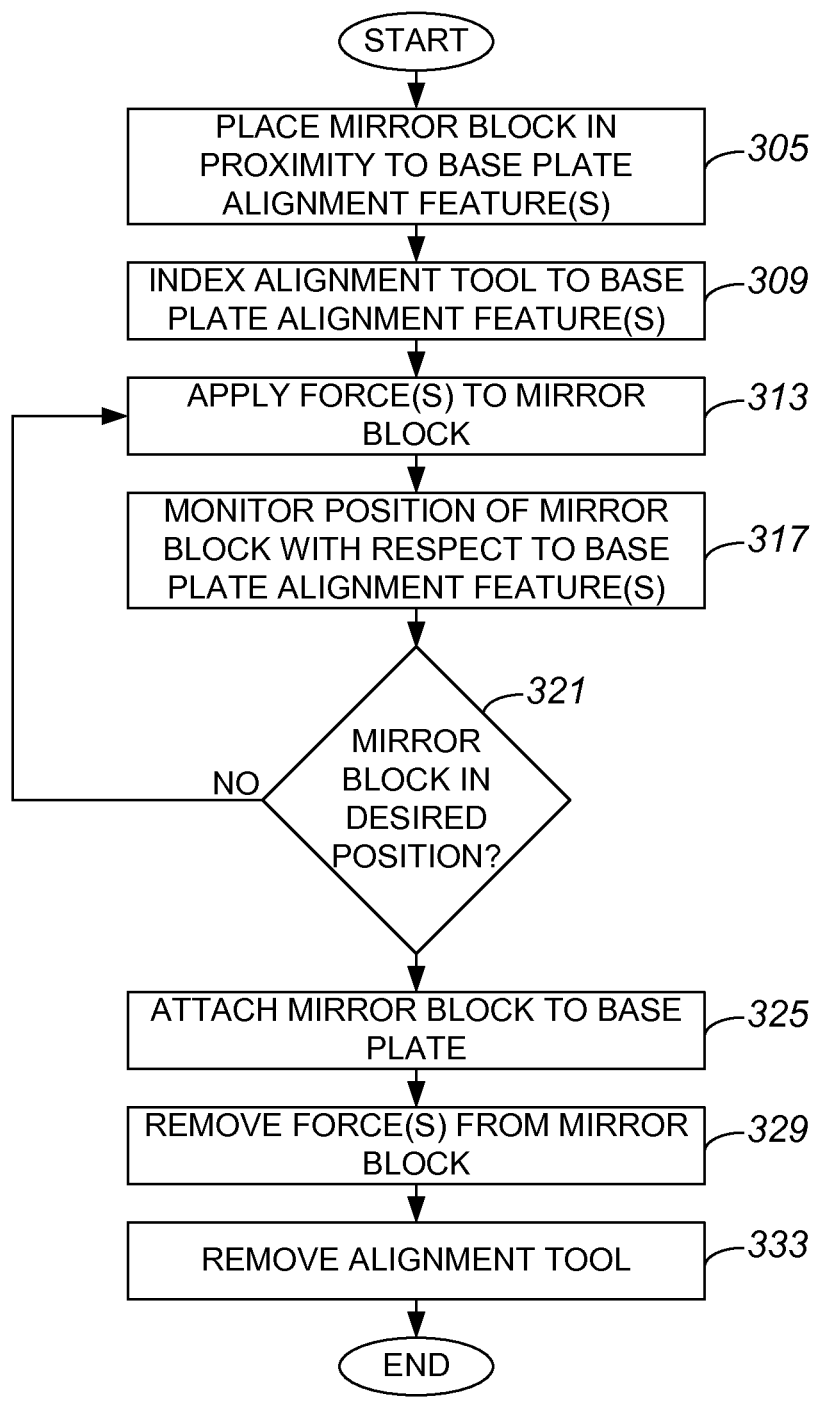
FIG. 3 is a process flow diagram which illustrates a method of aligning a mirror block to a base plate in accordance with an embodiment of the present invention.

Referring initially to FIG. 3, a process of aligning a mirror block to a base plate will be described in accordance with an embodiment of the present invention. A process 301 of aligning a mirror block to a base plate, e.g., a base plate that has a notched mounting surface with alignment features, begins at step 305 in which a mirror block is placed or otherwise positioned in proximity to at least one alignment feature of the base plate. In one embodiment, a mirror block may be placed in proximity to an alignment feature with a surface which is to be aligned with a surface of the mirror block. For example, a mirror block may be placed such that a side surface of the mirror block which is to be aligned with a side surface of an alignment feature is roughly lined up with the side surface of the alignment feature. In general, a bottom surface of the mirror block may be in contact with at least part of an upper surface of the base plate.

After the mirror block is placed in proximity to at least one base plate alignment feature, an alignment tool is indexed to at least one base plate alignment feature in step 309. Indexing the alignment tool may include positioning a component of the alignment tool at least partially against a surface of a base plate alignment feature, or against a surface of a mirror blocks that is in proximity to the base plate alignment feature. The alignment tool may include any number of components which may be indexed to base plate alignment features. In general, the alignment tool may include a component arranged to align sides of a mirror block that correspond to critical coordinates. By way of example, if a position relative to an x-axis, a position relative to a y-axis, and a rotational position relative to a z-axis are considered to be critical, the alignment tool may include components that are arranged to facilitate the alignment of sides off a mirror block with respect to those positions, as will be described below with respect to FIG. 4.

After the alignment tool is indexed to at least one base plate alignment feature, at least one force is applied to the mirror block in step 313. A force may be applied to the mirror block such that a surface of the mirror block comes into contact with the alignment tool, thereby enabling the alignment tool to align the surface with respect to a surface of the base plate alignment feature. Such a force may be applied manually, e.g., substantially directly by hand or via a tool. Generally, the alignment tool essentially provides a reaction force to forces that are applied to the mirror block. Hence, the alignment tool does not move significantly due to the forces applied to the mirror block. On the other hand, a force may be applied to the alignment tool to cause the alignment tool to impart a force on the mirror block when the alignment tool comes into contact with the mirror block. When more than one force is applied, it should be appreciated that each force that is applied may be associated with a different surface of the mirror block that is to be aligned.

Once at least one force is applied to the mirror block, the overall position of the mirror block is monitored in step 317 with respect to at least one base plate alignment feature. A sensor arrangement may generally be used to indicate whether a surface of a mirror block is approximately aligned with respect to a base plate alignment feature, as for example in a desired position. A determination is made in step 321 as to whether the mirror block is in a desired position. If the indication is that the mirror block is not in a desired position, process flow returns to step 313 in which at least one force continues to be applied to the mirror block.

Alternatively, if it is determined in step 321 that the mirror block is in a desired position, the implication is that the mirror block is aligned with respect to the base plate. Accordingly, in step 325, the mirror block is attached to the base plate. Attaching the mirror block to the base plate may include, but is not limited to including, screwing the mirror block into the base plate. In one embodiment, while the mirror block is being attached to the base plate, at least one force applied in step 313 continues to be applied. It should be appreciated, however, that in lieu of continuing to apply at least one force to the mirror block while the mirror block is being attached to the base plate, the mirror block may be substantially held in a desired position using other methods.

After the mirror block is attached to the base plate, substantially any force applied to the mirror block, e.g., a force applied in step 313, may be removed from the mirror block in step 329. Then, in step 333, the alignment tool is removed such that the alignment tool is no longer in contact with the mirror block, and the process of aligning a mirror block to a base plate is completed. Removing the alignment tool may include verifying that the mirror block is in a desired position after the alignment tool is removed.

Figure 4:
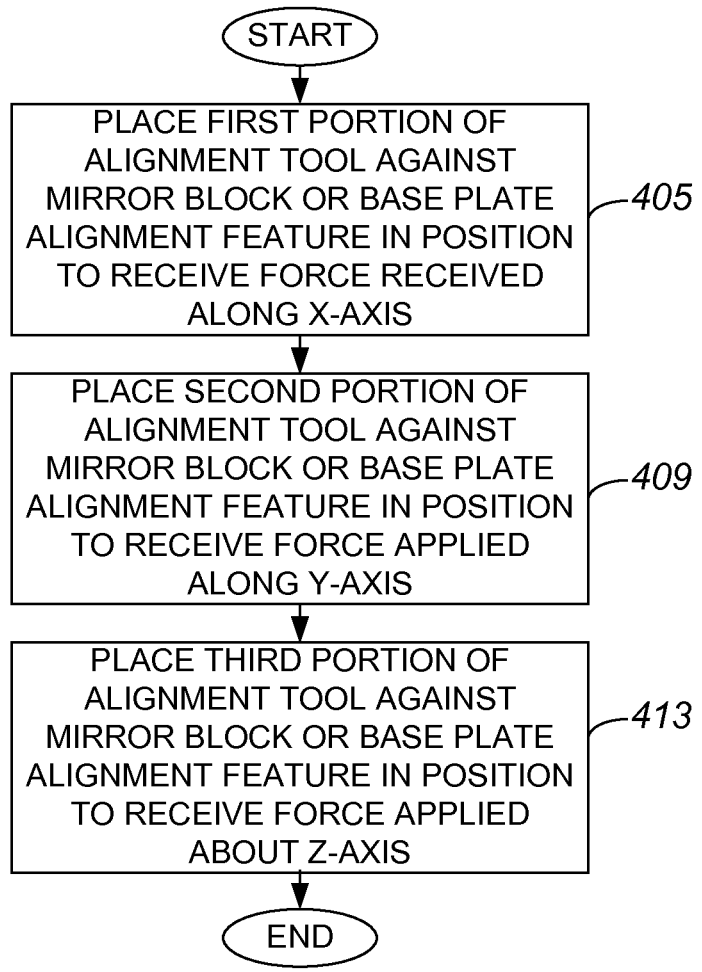
FIG. 4 is a process flow diagram which illustrates a method of indexing an alignment tool to base plate alignment features, e.g., step 309 of FIG. 3, in accordance with an embodiment of the present invention.

As previously mentioned, an alignment tool may be indexed with respect to at least one alignment feature on a base plate. In one embodiment, an alignment tool may be indexed to alignment features that are associated with effectively constraining at least three degrees of freedom. FIG. 4 is a process flow diagram which illustrates a method of indexing an alignment tool to base plate alignment features, e.g., step 309 of FIG. 3, in at least three locations in accordance with an embodiment of the present invention. A process 309 of indexing an alignment tool begins at step 405 in which a first portion or component of the alignment tool is placed against a mirror block and/or a base plate alignment feature in a position to receive a force applied along an x-axis. For example, a first portion of the alignment tool may be positioned in contact with a surface of a base plate alignment such that feature such that when force is eventually applied to the mirror block in an x-direction, the mirror block moves until the mirror block effectively abuts the first portion of the alignment tool and a surface of the mirror block is effectively lined up with the surface of the base plate.

In step 409, a second portion or component of the alignment tool is placed against a mirror block and/or a base plate alignment feature in a position to receive a force applied along a y-axis. The base plate alignment feature may be the same feature that the first portion of the alignment tool is placed against, or the base plate alignment feature may be a different feature. Finally, a third portion or component of the alignment tool is placed against a mirror block and/or a base plate alignment feature in step 413 in a position to receive a force applied about a z-axis. The base plate alignment feature that the third portion of the alignment tool is placed against may be the same as, or different from, the base plate alignment feature or features that the second portion and the third portion of the alignment tool are placed against. The process of indexing an alignment tool is completed once the third portion of the alignment tool is placed.

Figure 5:
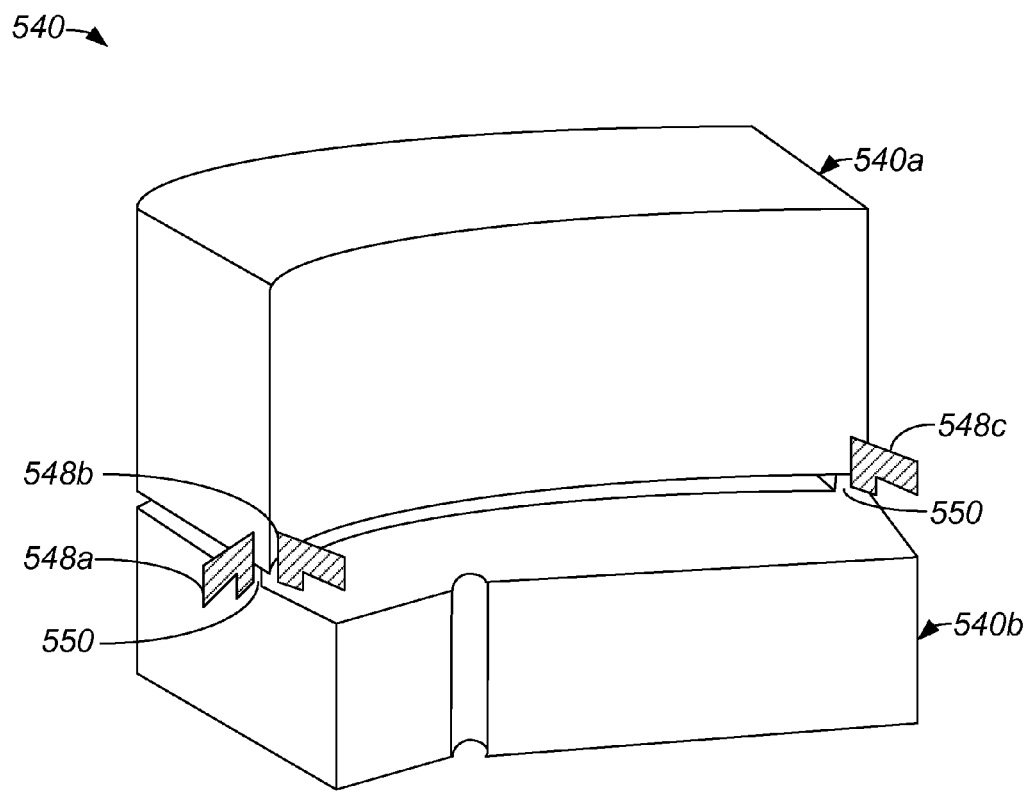
FIG. 5 is a block diagram representation of an alignment tool being used to align a mirror block with respect to a base plate in accordance with an embodiment of the present invention.

An alignment tool that is used to effectively externally align a mirror block with a base plate may be an apparatus that includes any number of portions, e.g., portions that are arranged to contact the mirror block and/or the base plate. As discussed above with respect to FIG. 4, an alignment tool may include approximately three portions. FIG. 5 is a block diagram representation of an alignment tool being used to align a mirror block with respect to a base plate in accordance with an embodiment of the present invention. A mirror assembly includes a mirror block 540*a* and a base plate 540*b* in which at least one alignment feature 550 has been machined. An alignment tool includes multiple portions or components 548*a-c* that are arranged to cooperate such that mirror block 540*a* may be aligned in a desired location with respect to base plate 540*b*. Portions 548*a-c* are positioned in proximity to mirror block 540*a* and base plate 540*b* before at least one force is applied to mirror block 540*a* during an alignment process in accordance with an embodiment of the present invention.

Portion 548*a* may generally be configured to allow mirror block 540*a* to be aligned with respect to an x-axis when a force is applied to mirror block 540*a* along the x-axis. Portion 548*b* may be indexed with respect to mirror block 540*a* and/or base plate 540*b* to allow mirror block 540*a* to be aligned with respect to a y-axis when a force is applied to mirror block 540*a* along the y-axis. Portions 548*b*, 548*c* may act together, or otherwise cooperate, to substantially constrain mirror block 540*a* rotationally with respect to a z-axis, and along the y-axis, when a force is applied to mirror block 540*a* along the y-axis. It should be appreciated that the force is applied along the y-axis between two constraints. As shown, portion 548*a* substantially constrains mirror block 540*a* along the x-axis.

Figure 6A:
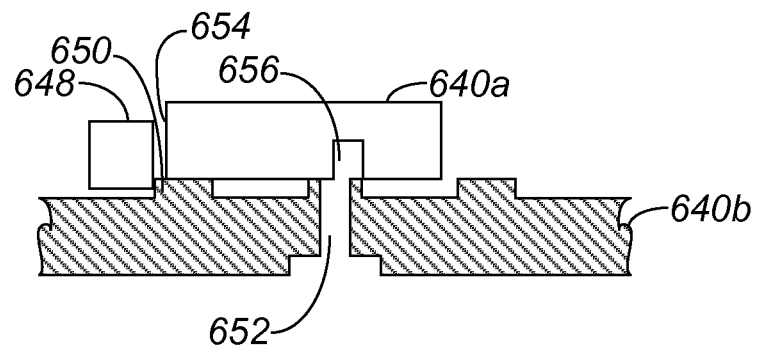
FIG. 6A is a cross-sectional side view representation of an alignment tool in proximity to a mirror block and a base plate before a force is applied to the mirror block during an alignment process in accordance with an embodiment of the present invention.

With reference to FIGS. 6A-D, the use of an external alignment tool to align a mirror block with respect to a base plate will be described in accordance with an embodiment of the present invention. FIG. 6A is a cross-sectional side view block diagram representation of an alignment tool in proximity to a mirror block and a base plate before a force is applied to the mirror block during an alignment process. A mirror block 640*a*, in which a receptacle 656 sized to accommodate a portion of a fastener is located, is positioned in contact with a base plate 640*b*. Mirror block 640*b*, which includes a surface 654 that is to be aligned, is generally positioned relatively close to a desired position for mirror block 640b. In the described embodiment, a desired position for mirror block 640b is a position in which surface 654 is aligned with a planar edge or surface of a base plate alignment feature 650.

An opening 652 is defined through base plate 640b, and base plate 640b includes at least one base plate alignment feature 650. A portion 648 of an alignment tool, i.e., an alignment tool portion, is positioned in contact with alignment feature 650. In one embodiment, a planar side surface of alignment tool portion 648 is indexed against, e.g., at least partially abuts, a planar side surface of alignment feature 650. Alignment tool portion 648 may be formed from a material that may withstand applied forces, and is unlikely to mar the surfaces of mirror block 640b. Suitable materials may include, but are not limited to including, plastics and metals. Plastics may include PTFE and PEEK, while metals may generally include relatively soft metals such as Indium and tin.

Figure 6B:
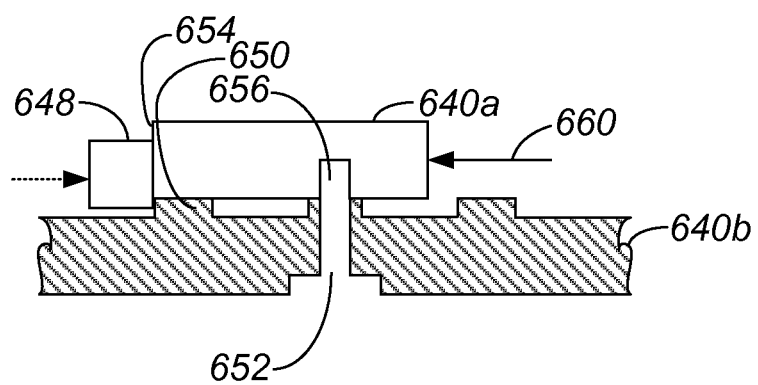
FIG. 6B is a cross-sectional side view representation of an alignment tool, e.g., alignment tool 648, in contact with a mirror block, e.g., mirror block 640*a* of FIG. 6A, when a force is applied to the mirror block during an alignment process in accordance with an embodiment of the present invention.

FIG. 6B is a block diagram representation of alignment tool portion 648 in contact with mirror block 640a when a force is applied to the mirror block during an alignment process. In general, a force may be applied to both a mirror block and an alignment tool. A force 660 is applied to mirror block 640a such that surface 654 of mirror block 640a comes into contact with alignment tool portion 648. Alignment tool portion 648 is arranged to provide a force that substantially counteracts force 660 that allows mirror block 640a to press up against alignment tool portion 648 substantially without causing alignment tool portion 648 to move. When mirror block 640a is in contact with alignment tool portion 648, surface 654 of mirror block 640a is aligned with, e.g., coplanar with respect to, a planar side surface of alignment feature 650. Hence, mirror block 640a is essentially in a desired position with respect to base plate 640b.

Figure 6C:
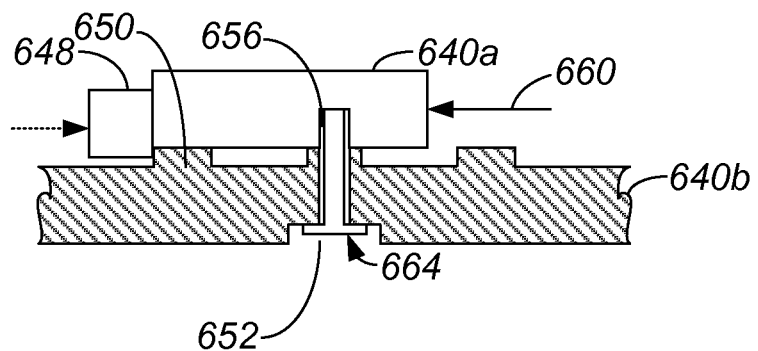
FIG. 6C is a cross-sectional side view representation of an alignment tool, e.g., alignment tool 648, in contact with a mirror block, e.g., mirror block 640*a* of FIG. 6A, after a fastener is positioned during an alignment process in accordance with an embodiment of the present invention.

Once mirror block 640a is in a desired position with respect to base plate 640b, mirror block 640a may be attached to base plate 640b. In one embodiment, mirror block 640a may be attached to base plate 640b using a fastener such as a screw, although it should be appreciated that mirror block 640a is not limited to being attached to base plate 640b using a fastener such as a screw. As shown in FIG. 6C, a screw 664 may be inserted through opening 652 that is defined in base plate 640b and through receptacle 656 defined in mirror block 640a. It should be appreciated that opening 652 and/or receptacle 656 may be threaded to accommodate threads in screw 664. While screw 664 is inserted through opening 652 into receptacle 656, force 660 may continue to be applied to mirror block 640a such that the desired position of mirror block 640a may be substantially maintained. In one embodiment, screw 664 may extend through liquid metal wells in a heat exchanger (not shown), and is not limited to extending through base plate 640b and mirror block 640a.

Figure 6D:
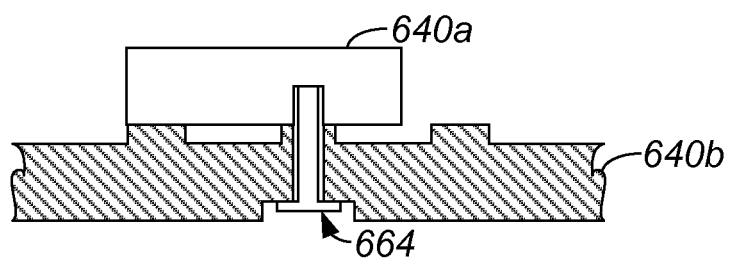
FIG. 6D is a cross-sectional side view representation of a mirror block assembly, e.g., a mirror block assembly formed from mirror block 640*a* and base plate 640*b* of FIG. 6A, after an alignment process in accordance with an embodiment of the present invention.

As shown in FIG. 6D, once screw 664 couples base plate 640b to mirror block 640a, force 660 may be removed from mirror block 640a. In addition, alignment tool portion 648 may be removed. Thus, a mirror assembly 640 that includes mirror block 640a and base plate 640b is effectively formed.

Figure 7A:
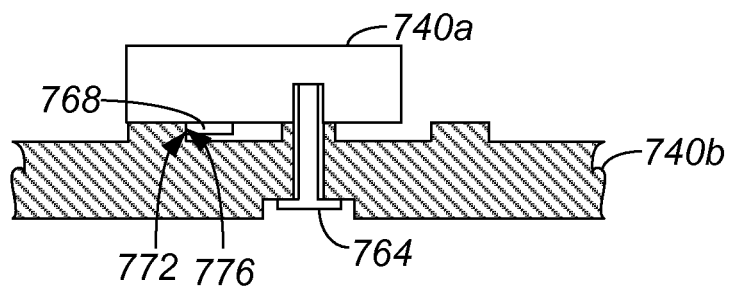
FIG. 7 is a cross-sectional side view representation of a mirror block assembly that includes a mirror block with an alignment feature in accordance with an embodiment of the present invention.

A base plate has generally been described as including alignment features. In one embodiment, a mirror block may also include alignment features that are configured to facilitate the positioning of the mirror block relative to a base plate. When a mirror block includes an alignment feature, the alignment feature of the mirror block may cooperate with an alignment feature of a base plate during an alignment process used in forming an overall mirror assembly. It should be appreciated that the alignment feature is not included in every embodiment, but may be included in some embodiments. FIG. 7 is a cross-sectional side view representation of a mirror block assembly that includes a mirror block which has an alignment feature in accordance with an embodiment of the present invention. A mirror block assembly 740 includes a mirror block 740a that is substantially attached to a base plate 740b by a fastener such as a screw 764. Mirror block 740a includes a mirror block alignment feature 768. Mirror block alignment feature 768 may be machined onto a surface of mirror block 740a, or mirror block alignment feature 768 may be attached, as for example glued, onto mirror block 740a after mirror block 740a is formed.

As shown, to facilitate aligning mirror block 740a with respect to base plate 740b, mirror block alignment feature 768 may be configured such that a surface 776 of mirror block alignment feature 768 is arranged to contact a surface 772, e.g., a surface of a base plate alignment feature, when mirror block 740a is in a desired position with respect to base plate 740b. By way of example, when mirror block 740a is aligned with base plate 740b, surface 776 abuts surface 772. In general, an external alignment tool (not shown) may cooperate with mirror block alignment feature 768 to align mirror block 740a with base plate 740b.

Figure 11:
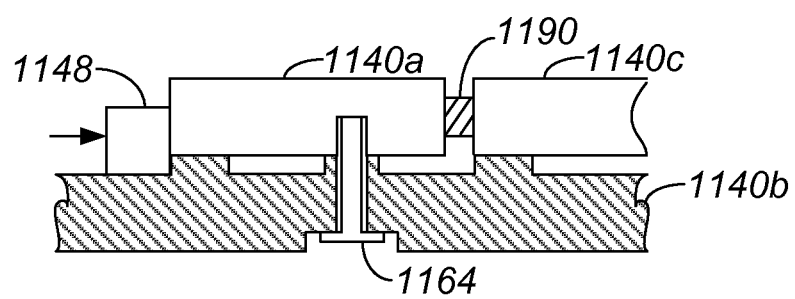
FIG. 11 is a cross-sectional side view representation of a mirror block assembly that uses a spacer to separate substantially adjacent mirror blocks in accordance with an embodiment of the present invention.

A mirror assembly typically includes multiple mirror blocks. Such multiple mirror blocks may be arranged in a grid or an array, and attached to a base plate that includes alignment features. When a mirror assembly includes multiple mirror blocks, spacers may be used to provide separation between adjacent mirror blocks during a mirror alignment process. FIG. 11 is a cross-sectional side view representation of a mirror block assembly that uses a spacer to separate substantially adjacent mirror blocks in accordance with an embodiment of the present invention. A mirror block assembly 1140 includes a base plate 1140b on which mirror blocks 1140a, 1140b are positioned. A spacer 1190, which may be arranged to be removed, e.g., dissolved, after an alignment process, effectively separates mirror block 1140a, which is being aligned with respect to base plate 1140b, and mirror block 1140c. It should be understood that spacer 1190 may, in some instances, be maintained between mirror blocks 1140a, 1140c.

During an alignment process, a force may be applied to a portion 1148 of an alignment tool that is configured to align mirror block 1140a with respect to base plate 1140b. Spacer 1190 may be configured, in one embodiment, to substantially prevent mirror block 1140a from coming into contact with mirror block 1140c while mirror block 1140a is being positioned using portion 1148 of the alignment tool. Once mirror block 1140a is positioned in approximately a desired position, a screw 1164 may be used to secure mirror block 1140a to base plate 1140b.

Figure 8:
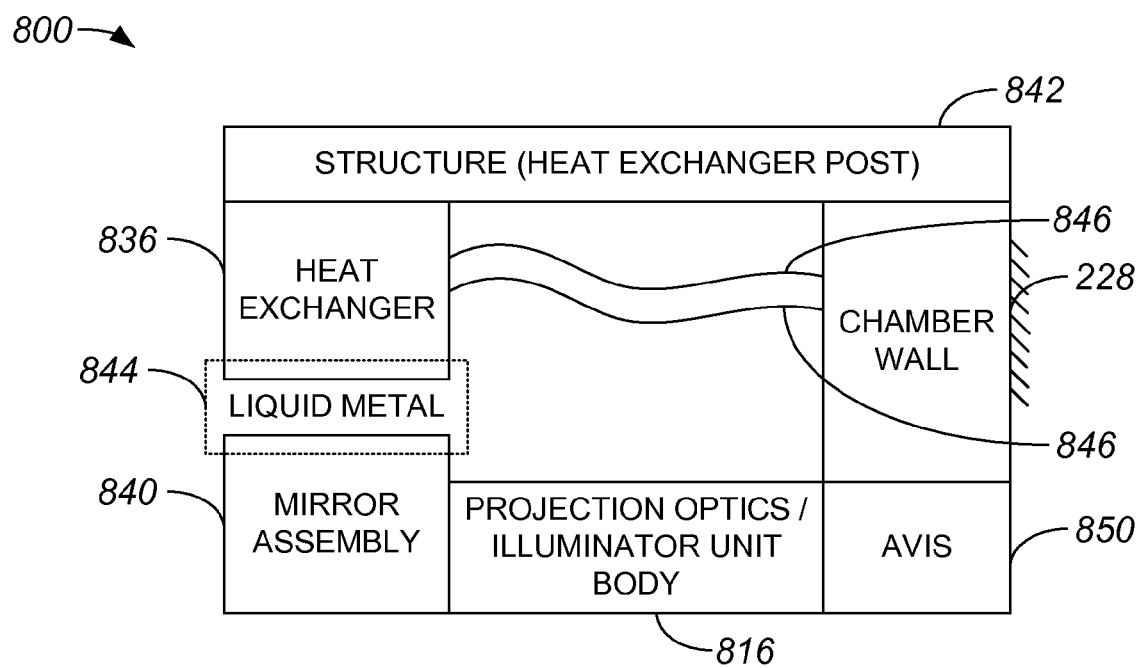
FIG. 8 is a diagrammatic representation of a portion of a EUV lithography system which includes a liquid metal interface between a heat exchanger and a mirror in accordance with an embodiment of the present invention.

As previously mentioned, a mirror alignment process may be used in creating a multi-element mirror assembly that is used in a EUV lithography system. In one embodiment, a multi-element mirror may have a liquid metal interface with a heat exchanger, as described in co-pending U.S. patent application Ser. No. 12/261,798, which has been incorporated by reference. With reference to FIG. 8, a EUV lithography system which includes a mirror assembly that has a liquid metal interface with a heat exchanger will be described in accordance with an embodiment of the present invention. A EUV lithography system 800 includes a vacuum chamber which has a chamber wall 828. Chamber wall 828 is generally coupled to an active vibration isolation system (AVIS) 850 which is configured to isolate a projection optics/illuminator unit (PO/IU) body 816 from external vibrations, e.g., ground vibrations or stage vibrations. It should be appreciated that chamber wall 828 may generally be substantially grounded, or otherwise coupled to an external ground surface.

PO/IU body 816 has optical elements of EUV lithography system 800. In one embodiment, PO/IU body 816 is coupled to AVIS 850 such that AVIS 850 may reduce vibrations transmitted to PO/IU body 816.

A heat exchanger 836 is coupled to chamber wall 828 via a structure 842, e.g., a heat exchanger post. In other words, heat exchanger is relatively rigidly coupled to chamber wall 828 through structure 842. Coolant hoses 848 pass between heat exchanger 836 and chamber wall 828. Coolant hoses 846 provide cooled fluid to heat exchanger 836, which is located in a vacuum held by chamber wall 828, and also remove heated fluid from heat exchanger 836.

A mirror assembly 840, e.g., a mirror assembly in which mirror blocks (not shown) are aligned with respect to a base plate (not shown) using an external tool, is coupled to PO/IU body 816. As will be appreciated by those skilled in the art, mirror assembly 840 and PO/IU body 816 are within a vacuum contained by chamber wall 828. Heat exchanger 836 is not in direct contact with mirror assembly 840. A liquid metal interface 844 allows a heat load in mirror assembly 840 to pass to heat exchanger 836. That is, liquid metal interface 844 is arranged to effectively provide a substantially indirect connection between mirror assembly 840 and heat exchanger 836. As such, heat exchanger 836 is substantially vibrationally isolated from mirror assembly 840 and from PO/IU body 816. When heat exchanger 836 is vibrationally isolated from PO/IU body 816, the use of a turbulent flow in heat exchanger 836 may improve the efficiency of heat exchanger 836 substantially without imparting significant vibrations on PO/IU body 816. It should be appreciated that the transmission of vibrations through heat exchanger 836 from other sources including, but not limited to including, coolant hoses 846, stages (not shown), and a ground (not shown) may also be substantially attenuated.

Liquid metal interface 844 includes liquid metal that is in contact with both mirror assembly 840 and heat exchanger 836. As will be discussed below, liquid metal interface 844 may include amounts of liquid metal substantially contained within a cavity, well, groove, or trough in mirror assembly 840.

Figure 9:
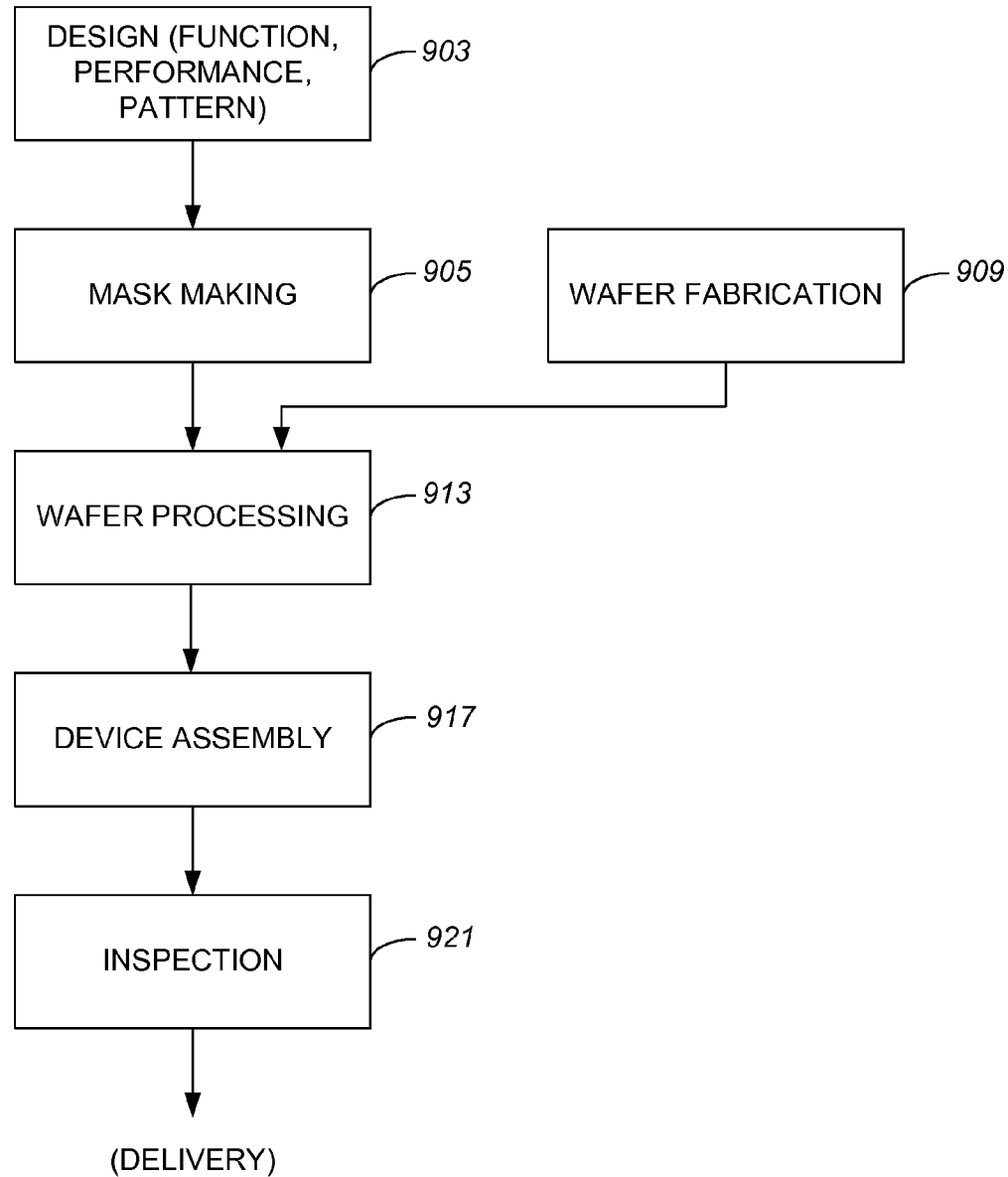
FIG. 9 is a process flow diagram which illustrates the steps associated with fabricating a semiconductor device in accordance with an embodiment of the present invention.

FIG. 9 is a process flow diagram which illustrates the steps associated with fabricating a semiconductor device using a EUV lithograph system that includes a mirror assembly aligned using the methods described above in accordance with an embodiment of the present invention. A process 901 of fabricating a semiconductor device begins at step 903 in which the function and performance characteristics of a semiconductor device are designed or otherwise determined. Next, in step 905, a reticle or mask in which has a pattern is designed based upon the design of the semiconductor device. It should be appreciated that in a substantially parallel step 909, a wafer is typically made from a silicon material. In step 913, the mask pattern designed in step 905 is exposed onto the wafer fabricated in step 909 through the use of an EUV lithography system. One process of exposing a mask pattern onto a wafer will be described below with respect to FIG. 10. In step 917, the semiconductor device is assembled. The assembly of the semiconductor device generally includes, but is not limited to including, wafer dicing processes, bonding processes, and packaging processes. Finally, the completed device is inspected in step 921. Upon successful completion of the inspection in step 921, the completed device may be considered to be ready for delivery.

Figure 10:
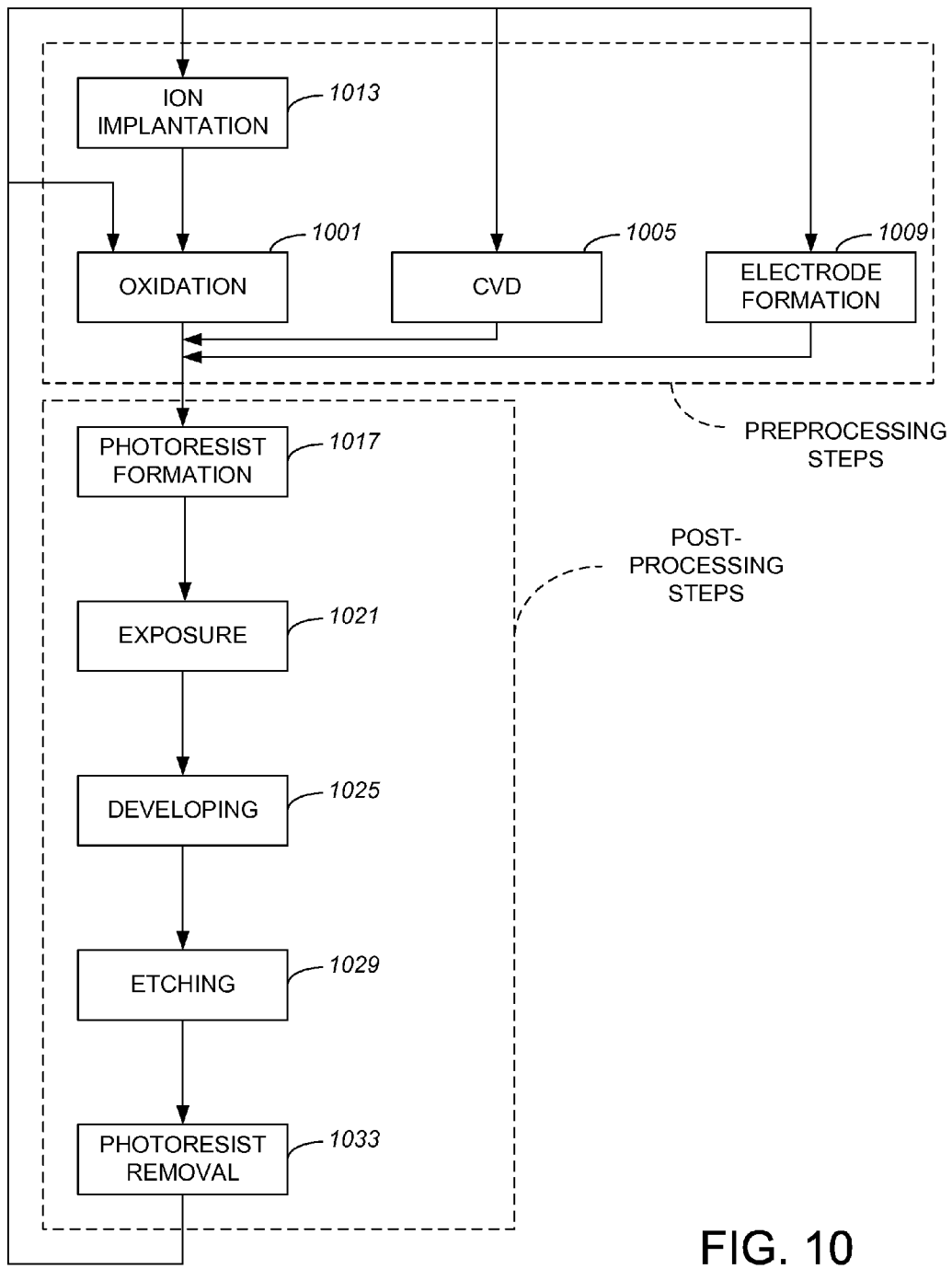
FIG. 10 is a process flow diagram which illustrates the steps associated with processing a wafer, i.e., step 904 of FIG. 9, in accordance with an embodiment of the present invention.

FIG. 10 is a process flow diagram which illustrates the steps associated with wafer processing in the case of fabricating semiconductor devices in accordance with an embodiment of the present invention. In step 1001, the surface of a wafer is oxidized. Then, in step 1005 which is a chemical vapor deposition (CVD) step in one embodiment, an insulation film may be formed on the wafer surface. Once the insulation film is formed, then in step 1009, electrodes are formed on the wafer by vapor deposition. Then, ions may be implanted in the wafer using substantially any suitable method in step 1013. As will be appreciated by those skilled in the art, steps 1001-1013 are generally considered to be preprocessing steps for wafers during wafer processing. Further, it should be understood that selections made in each step, e.g., the concentration of various chemicals to use in forming an insulation film in step 1005, may be made based upon processing requirements.

At each stage of wafer processing, when preprocessing steps have been completed, post-processing steps may be implemented. During post-processing, initially, in step 1017, photoresist is applied to a wafer. Then, in step 1021, an exposure device may be used to transfer the circuit pattern of a reticle to a wafer. Transferring the circuit pattern of the reticle of the wafer generally includes scanning a reticle scanning stage which may, in one embodiment, include a force damper to dampen vibrations.

After the circuit pattern on a reticle is transferred to a wafer, the exposed wafer is developed in step 1025. Once the exposed wafer is developed, parts other than residual photoresist, e.g., the exposed material surface, may be removed by etching in step 1029. Finally, in step 1033, any unnecessary photoresist that remains after etching may be removed. As will be appreciated by those skilled in the art, multiple circuit patterns may be formed through the repetition of the preprocessing and post-processing steps.

Although only a few embodiments of the present invention have been described, it should be understood that the present invention may be embodied in many other specific forms without departing from the spirit or the scope of the present invention. By way of example, the configuration of a feature provided on a base plate may vary widely. In general, substantially any feature which has a side or edge that may be aligned with a side or edge of a mirror element may be provided on a base plate. Such a feature typically has a flat edge that is arranged to be aligned with a flat edge of a mirror element.

While features on a base plate may be machined onto the base plate, e.g., using a milling process, features on a base plate are not limited to being machined onto the base plate. For instance, features may be elements that are attached to a base plate using any suitable attachment method including. Suitable attachment methods include, but are not limited to including, using adhesive to attach features to a base plate and/or using a fastener such as a screw or a bolt to attach features to a base plate.

A base plate may have a mounting region that is notched to substantially limit the effect of thermal expansion between a mirror element and a base plate to which the mirror element is attached. It should be appreciated, however, that a base plate is not limited to including a notched mounting region. In some instances, a base plate may not be notched, and may include other features that may substantially mitigate the effect of thermal expansion. In one embodiment, individual mirror elements may be sized such that bending distortion due to a thermal gradient may be relatively low.

A method of aligning a mirror block with respect to a base plate may be substantially automated, substantially manual, or both automated and manual. That is, a system which aligns a mirror block and a base plate that are included in a mirror block assembly may be a substantially automated system, a substantially manual system, or both an automated and manual system. For example, a machine may be used to position a mirror block and to attach the mirror block to a base plate, or a human may position the mirror block and attach the mirror block to the base plate. Alternatively, a machine and a human may cooperate to position a mirror block and to attach the mirror block to a base plate.

The operations associated with the various methods of the present invention may vary widely. By way of example, steps may be added, removed, altered, combined, and reordered without departing from the spirit or the scope of the present invention. Steps may be repeated, for example, when an array of mirror blocks is to be attached to a shared base plate. When multiple mirror blocks are to be aligned and attached with respect to a shared base plate, edges of mirror blocks which are already attached to the shared base plate may serve to aid in the alignment of mirror blocks which are to be attached to the shared base plate.

In lieu of applying a force to a mirror block during an alignment process, a force may be applied to an alignment tool. For example, a force may be applied to an alignment tool that is arranged to push a surface of the mirror block substantially until the alignment tool comes into contact with a surface of a base plate alignment feature. When the alignment tool comes into contact with the surface of a base plate alignment feature, the surface of the mirror block that was in contact with the alignment tool may be approximately aligned with the surface of the base plate alignment feature. In other words, an alignment tool may be arranged to essentially push against a mirror block during an alignment process, and is not limited to being pushed on by a mirror block during an alignment process.

The many features and advantages of the present invention are apparent from the written description. Further, since numerous modifications and changes will readily occur to those skilled in the art, the invention should not be limited to the exact construction and operation as illustrated and described. Hence, all suitable modifications and equivalents may be resorted to as falling within the scope of the invention.

What is claimed is:

1. A method for forming a mirror assembly, the mirror assembly including a mirror block and a base plate, the base plate including at least one base plate alignment feature, the method comprising:
   positioning the mirror block in contact with the base plate;
   indexing at least one portion of an alignment tool with respect to the base plate;
   applying at least a first force, wherein applying at least the first force includes moving the mirror block with respect to the at least one base plate alignment feature;
   determining when a first surface of the mirror block is substantially coplanar with a first surface of the at least one base plate alignment feature, wherein determining when the first surface of the mirror block is substantially coplanar with the first surface of the at least one base plate alignment feature includes determining when the at least one portion of the alignment tool abuts the first surface of the mirror block and the first surface of the at least one base plate alignment feature; and
   coupling the mirror block to the base plate when it is determined that the first surface of the mirror block is substantially coplanar with the first surface of the at least one base plate alignment feature.

2. The method of claim 1 wherein indexing the at least one portion of the alignment tool at least in proximity to the base plate include positioning the at least one portion of the alignment tool in contact with the first surface of the base plate alignment feature, and wherein the method further includes:
   removing the at least one portion of the alignment tool from being in contact with the first surface of the base plate alignment feature.

3. The method of claim 1 wherein the mirror block includes a second surface, and applying the at least first force includes applying the at least first force to the second surface of the mirror block.

4. The method of claim 1 wherein coupling the mirror block to the base plate includes screwing the base plate to the mirror block.

5. The method of claim 1 wherein the mirror block defines a receptacle therein and the base plate defines an opening therein, and wherein screwing the base plate to the mirror block includes inserting a screw through the opening into the receptacle.

6. The method of claim 1 wherein indexing at least one portion of an alignment tool with respect to the base plate includes indexing at least a first portion of the alignment tool, a second portion of the alignment tool, and a third portion of the alignment tool.

7. The method of claim 6 wherein the first portion of the alignment tool is associated with aligning the mirror block relative to an x-axis, the second portion of the alignment tool is associated with aligning the mirror block relative to a y-axis, and the third portion of the alignment tool is associated with aligning the mirror block about a z-axis.

8. The method of claim 7 wherein applying at least the first force includes applying the first force along the x-axis, applying a second force along the y-axis, and applying the third force about the z-axis.

9. The method of claim 1 wherein applying at least the first force includes applying the first force to the at least one portion of the alignment tool to cause the mirror block to move.

10. The method of claim 9 wherein indexing the at least one portion of the alignment tool with respect to the base plate includes indexing the at least one portion against the first surface of the mirror block.

11. The method of claim 1 wherein the mirror block is included in a plurality of mirror blocks, and the mirror assembly is a multi-element mirror assembly configured for use in an extreme ultraviolet (EUV) lithography system.

* * * * *